(12) United States Patent
Wang

(10) Patent No.: US 7,315,067 B2
(45) Date of Patent: Jan. 1, 2008

(54) NATIVE HIGH-VOLTAGE N-CHANNEL LDMOSFET IN STANDARD LOGIC CMOS

(75) Inventor: Bin Wang, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 7 days.

(21) Appl. No.: 10/884,236

(22) Filed: Jul. 2, 2004

(65) Prior Publication Data

US 2006/0001087 A1 Jan. 5, 2006

(51) Int. Cl.
H01L 29/43 (2006.01)
(52) U.S. Cl. .................................. 257/412; 257/E29.16
(58) Field of Classification Search ................ 257/335, 257/336, 339, 343, 412, E29.16
See application file for complete search history.

(56) References Cited

U.S. PATENT DOCUMENTS

| | | | |
|---|---|---|---|
| 5,485,027 A | 1/1996 | Williams et al. | |
| 5,553,030 A | 9/1996 | Tedrow et al. | |
| 6,023,188 A | 2/2000 | Lee et al. | |
| 6,097,070 A * | 8/2000 | Mandelman et al. | 257/389 |
| 6,160,290 A * | 12/2000 | Pendharkar et al. | 257/339 |
| 6,177,830 B1 | 1/2001 | Rao | |
| 6,211,552 B1 * | 4/2001 | Efland et al. | 257/343 |
| 6,559,683 B1 | 5/2003 | Kwon et al. | |
| 6,593,621 B2 * | 7/2003 | Tsuchiko et al. | 257/335 |
| 6,661,278 B1 | 12/2003 | Gilliland | |
| 6,665,012 B1 * | 12/2003 | Yang et al. | 348/308 |
| 6,678,190 B2 | 1/2004 | Yang et al. | |
| 6,730,458 B1 * | 5/2004 | Kim et al. | 430/296 |
| 6,734,493 B2 * | 5/2004 | Chen et al. | 257/328 |
| 6,831,331 B2 | 12/2004 | Kitamura et al. | |
| 6,873,021 B1 | 3/2005 | Mitros et al. | |
| 6,882,023 B2 * | 4/2005 | Khemka et al. | 257/493 |
| 2002/0028541 A1 * | 3/2002 | Lee et al. | 438/149 |

OTHER PUBLICATIONS

Declercq et al. "Design and Optimization of High-Voltage CMOS Devices Compatible with a Standard 5V CMOS Technology" IEEE 1993 Custom Integrated Circuits Conference. p. 24.6.1-24.6.4. (a clean copy with added reference numerals).*

(Continued)

Primary Examiner—Lynne Gurley
Assistant Examiner—Andrew O. Arena
(74) Attorney, Agent, or Firm—Thelen Reid Brown Raysman & Steiner LLP

(57) ABSTRACT

A native high-voltage n-channel LDMOSFET includes a p– doped substrate, a first n+ doped region disposed in the p– doped substrate, a source terminal coupled to the first n+ doped region, an n– well disposed in the substrate, a second n+ doped region disposed in the n– well, a drain terminal coupled to the second n+ doped region, a p+ doped region disposed in the substrate, a body terminal coupled to the p+ doped region, a dielectric layer disposed over the p– doped substrate and a portion of the n– well, a first trench disposed in the n– well, the trench filled with a dielectric material that is in contact with the dielectric layer, a second trench disposed at least partially in the n– well, the second trench filled with a dielectric material and isolating the second n+ region from the p+ region, and a gate partially or fully reversely doped with p+ implant (or an equivalent technique) and disposed over the dielectric layer and a portion of the first trench.

24 Claims, 2 Drawing Sheets

OTHER PUBLICATIONS

Vishnu Khemka et al., "A Floating RESURF (FRESURF) LD-MOSFET Device Concept", IEEE Electron Device Letters, vol. 24, No. 10, Oct. 2003, pp. 664-666.

Bassin, et al., "High-Voltage Devices for 0.5-μm Standard CMOS Technology", IEEE Electron Device Letters, vol. 21, No. 1, Jan. 2000, pp. 41-42.

Declercq, et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an, Improved Voltage Multiplier Technique", IEEE Journal of Solid-State Circuits, vol. SC-11, No. 3, Jun. 1976, pp. 374-378.

Favrat, et al., "A High-Efficiency CMOS Voltage Doubler", IEEE Journal of Solid-State Circuits, vol. 33, No. 3, Mar. 1998, pp. 410-416.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

* cited by examiner

NATIVE HIGH-VOLTAGE N-CHANNEL LDMOSFET IN STANDARD LOGIC CMOS

RELATED APPLICATIONS

This application may be considered related to U.S. patent application Ser. No. 10/884,326 filed on Jul. 2, 2004, entitled "Graded-Junction High-Voltage MOSFET in Standard Logic CMOS" in the name of the same inventor and commonly assigned herewith.

FIELD OF THE INVENTION

The present invention relates generally to high-voltage transistors. More particularly, the present invention relates to a native high-voltage n-channel LDMOSFET (laterally diffused metal oxide semiconductor field effect transistor) fabricated in a standard logic CMOS (complementary MOS) process.

BACKGROUND OF THE INVENTION

LDMOSFETs (laterally diffused MOSFETs) are known. Such devices are used as high-voltage switches and components in devices fabricated in various MOS process (fabrication) technologies including logic CMOS and the like but having relatively high-voltage requirements (e.g., 10 volts in a 3.3 volt process). Such high-voltages are used in charge pumps, programming nonvolatile memory circuits, on-chip LCD (liquid crystal display) display drivers, on-chip field-emission display drivers, and the like. A typical LDMOSFET 10 (also referred to as an LDMOS) is shown in elevational cross-section in FIG. 1. LDMOS 10 is fabricated in a p− substrate 12. A first n+ doped region 13 is disposed in first p− well 14 of substrate 12. A source terminal 16 is coupled to first n+ doped region 13. A p+ doped region 18 is disposed in second p− well 15. A body terminal 20 is coupled to p+ doped region 18. An n− well 22 is disposed in p− substrate 12 between first p− well 14 and second p− well 15. A first isolation structure 23 such as first trench 24 is disposed in n− well 22. An isolation structure 23 such as first trench 24 is filled with an insulating dielectric material such as silicon dioxide which may be deposited or grown in any convenient manner such as using the well-known Shallow Trench Isolation (STI) process (as shown) or the well-known Local Oxidation of Silicon (LOCOS) process (not shown). A second n+ region 28 is disposed in n− well 22. A drain terminal 30 is coupled to said second n+ region 28. Second isolation structure 25 such as trench 26 is disposed at least partially in n− well 22 and acts to isolate second n+ region 28 from p+ region 18. A layer of dielectric 33 is disposed over a portion of first p− well 14, the p− well/n− well junction region 34, a portion of n− well 22 and a portion of first trench 24 as illustrated. A gate region 32 is in contact with the dielectric layer 33 as well as the dielectric material in first trench 24. Gate region 32 may comprise n+ doped polysilicon material, p+ doped polysilicon material, metal, or any other suitable material used for forming a conductive gate. Insulating end caps 36 and 38 are also provided. The region denoted Lc is the channel of the device extending from the source region 13 to the first isolation structure 23, as shown, and Lc denotes its length. The region denoted Lw is a region of lateral diffusion of n− well 22 under the gate and Lw denotes its length. The region denoted Lo is a region extending from one end of the channel to the end of the gate (where the gate extends over the first isolation structure 23), as shown, and Lo denotes its length. The region denoted Ldp is the width of the first isolation structure 24. It provides gate isolation.

In this device the n− well is used as the drain of the device. A high breakdown voltage is provided due to lateral diffusion in the region denoted Lw under the gate. This results in deep junctions with lower doping than a typical n+ drain implant. The breakdown voltage is determined by the doping concentration of the n-well (approximately $10^{17}/cm^3$) and p-well (approximately $10^{17}/cm^3$) of the n-well/p-well junction. The prior art embodiment shown uses shallow trench isolation (STI). Similar embodiments implementing a LOCOS isolation scheme are also well known in the art.

As device geometries and minimum feature sizes (MFS) shrink, e.g., from 0.18 micron MFS to 0.13 micron MFS to 0.09 micron MFS and smaller, new ways to provide relatively high breakdown voltages, particularly in logic CMOS processes, become more and more important. Logic CMOS is important because it is commonly available at low cost with minimum process steps. Accordingly, it would be highly desirable to provide an improved high-voltage switching device.

SUMMARY OF THE INVENTION

A native high-voltage n-channel LDMOSFET is formed on a p− substrate. An n− well is formed in the substrate. A first n+ region is formed in the substrate and a second n+ region is formed in the n− well. A first isolator is disposed in the n− well and a second isolator is disposed at least partially in the n− well. The second n+ region is disposed between the first isolator and the second isolator. A p+ region is disposed in the substrate so that the second isolator isolates it from the second n+ region. A portion of the n− well adjacent to the first isolator is laterally adjacent to the substrate and, in operation of the LDMOSFET, forms a region of lateral diffusion. Over the substrate and lateral diffusion region between the first n+ region and the first isolator is disposed a relatively thin gate dielectric layer in contact with the first isolator. The first and second isolator include dielectric material. A source terminal is coupled to the first n+ region, a drain terminal is coupled to the second n+ region, and a body terminal is coupled to the p+ region. A gate is disposed over the relatively thin dielectric layer and a portion of the first isolator. The gate comprises at least a section including p+ doped polysilicon. The p+ doped section of the gate may extend throughout the entire gate or the gate may be formed with one or more sections of p+ doped polysilicon interspersed with other conductive material, such as n+ doped polysilicon or metal. The p+ doped section accumulates the surface of p− substrate to prevent formation of a current channel underneath the thin gate dielectric and reduce leakage current. The device is fabricated in a standard logic CMOS process with no additional processing steps being required.

This approach obviates the need for a p− well, channel doping (e.g., between the source and drain), and anti-punch-through ion implantation. STI, LOCOS and other suitable processes may be used for forming the isolators.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention described in the following detailed description are directed at high-voltage n-channel MOSFET devices. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{20}$ atoms per cubic centimeter. The symbol n– indicates an n-doped semiconductor material typically having a doping level on the order of $10^{17}$ atoms per cubic centimeter. The symbol p+ indicates a p-doped semiconductor material typically having a doping level of p-type dopants on the order of $10^{20}$ atoms per cubic centimeter. The symbol p– indicates a p– doped semiconductor material typically having a doping level on the order of $10^{17}$ atoms per cubic centimeter for p– doped wells and on the order of $10^{15}$ atoms per cubic centimeter for p– substrate material. Those of ordinary skill in the art will now realize that a range of doping concentrations around those described above will also work. Essentially, any process capable of forming pFETs and nFETs will work. Doped regions may be diffusions or they may be implanted. When it is said that something is doped at approximately the same level as something else, the doping levels are within a factor of ten of each other, e.g., $10^{16}$ is within a factor of ten of $10^{15}$ and $10^{17}$.

Figure 1:
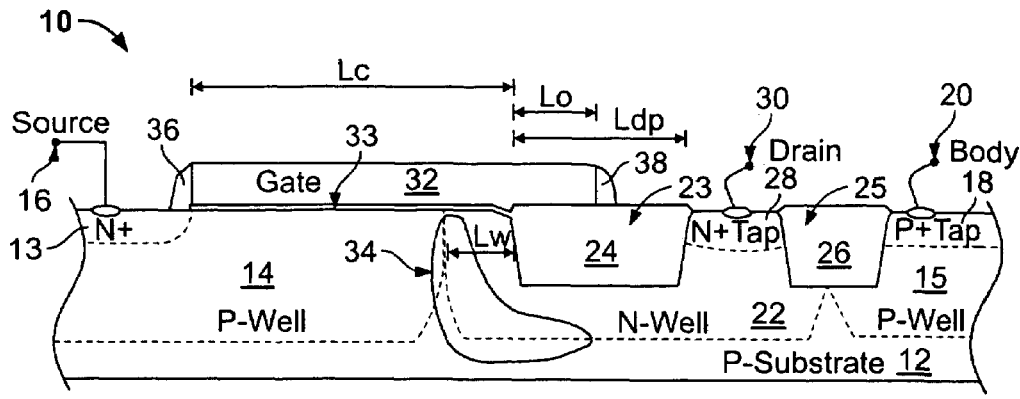
FIG. 1 is an elevational cross-sectional diagram of a lateral diffusion n-channel MOSFET in accordance with the prior art.
Figure 2:
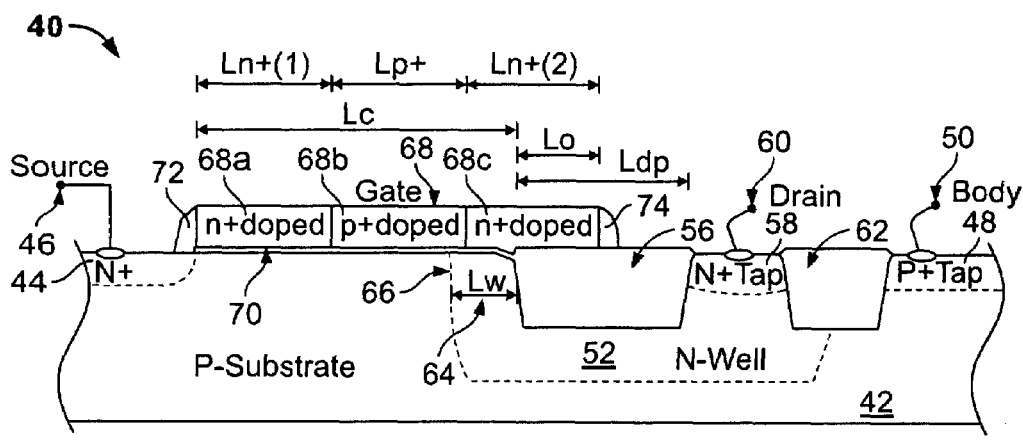
FIG. 2 is an elevational cross-sectional diagram of a native high-voltage n-channel MOSFET in accordance with an embodiment of the present invention.
Figure 3:
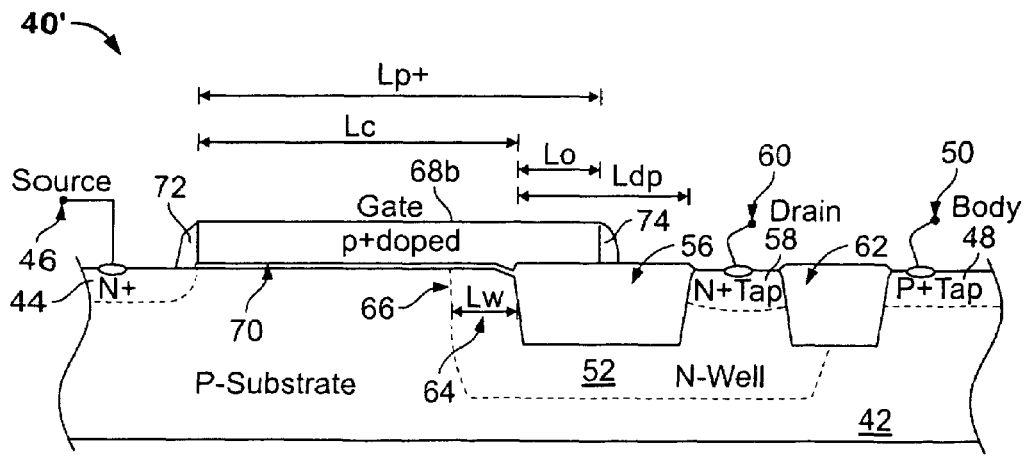
FIG. 3 is an elevational cross-sectional diagram of a native high-voltage n-channel MOSFET in accordance with another embodiment of the present invention.

Turning now to FIG. 2, FIG. 2 is an elevational cross-sectional diagram of a native high-voltage n-channel MOSFET 40 in accordance with an embodiment of the present invention. NMOSFET 40 is formed on a p– substrate 42. A first n+ doped region 44 is disposed in substrate 42. A source terminal 46 is coupled to first n+ doped region 44. A p+ doped region 48 is disposed in substrate 42. A body terminal 50 is coupled to p+ doped region 48. An n– well 52 is also disposed in substrate 42. A first isolator 56 such as a trench is disposed in n– well 52. First isolator 56 comprises a dielectric material such as silicon dioxide which may be deposited or grown in any convenient manner such as by using the STI or LOCOS process. A second n+ region 58 is disposed in n– well 52. A drain terminal 60 is coupled to said second n+ region 58. Second isolator 62 such as a trench is disposed at least partially in n– well 52 and acts to isolate second n+ region 58 from p+ region 48. Isolator 62 comprises a dielectric material like first isolator 56. A lateral diffusion region 64 exists in n– well 52 between isolator 56 and boundary 66 between n– well 52 and substrate 42 under gate 68. A relatively thin layer of dielectric 70 is disposed over a portion of substrate 42, lateral diffusion region 64 and a portion of first isolator 56 as illustrated. Gate 68 is in contact with the thin dielectric material layer 70 and the dielectric material of first isolator 56. Gate 68 comprises, in accordance with this embodiment of the present invention, a first n+ doped polysilicon portion 68a, a first p+ doped polysilicon portion 68b and a second n+ doped polysilicon portion 68c, as shown. Portions 68a and 68c could alternatively be formed of any other suitable conductive material used for forming a conductive gate such as p+ doped polysilicon or metal. Insulating end caps 72 and 74 are also provided as is well-known to those of ordinary skill in the art. FIG. 3 illustrates a version 40' of the NMOSFET 40 of FIG. 2 wherein the gate 68 is formed entirely of p+ doped polysilicon.

The region denoted Lc is the channel of the device extending from the source region 44 to the first isolator 56, as shown, and Lc denotes its length. The region denoted Lw is a region of lateral diffusion 64 under the gate 68 and Lw denotes its length. The region denoted Lo is a region extending from one end of the channel to the end of the gate 68 (where the gate extends over the first isolator 56), as shown, and Lo denotes its length. The region denoted Ldp is, essentially, the width of the first isolator 56 and Ldp denotes its length. It provides gate isolation. The region denoted Ln+(1) is the first n+ doped polysilicon portion 68a of gate 68 and Ln+(1) denotes its length. The region denoted Ln+(2) is the second n+ doped polysilicon portion 68c of gate 68 and Ln+(2) denotes its length. The region denoted Lp+ is the p+ doped polysilicon portion 68b of gate 68 and Lp+ denotes its length. As mentioned above, regions 68a and 68c are not required and may also be fabricated of metal or other suitable conductive material, if present.

This approach means that p– well, nFET channel doping and anti-punch-through ion implant are not required to form a high-voltage NMOSFET device in native CMOS technology. This is because the breakdown voltage of the n– well/p– substrate junction is much higher than the breakdown voltage of the n– well/p– well junction. This is due to the fact that the dopant concentration of p– substrate is roughly a factor of 100 less than that of p– well.

However, the omission of channel doping induces the formation of carriers in the region of the channel (Lc) on the surface of the substrate even without voltage bias on the gate and thus leads to difficulty in switching off the NMOSFET and to higher off-state leakage currents. P+ doping of the gate (partial or full) denoted Lp+ accumulates the surface to prevent formation of a carrier channel and thus no carriers are available for flowing between the source and the drain regions to mitigate this leakage current.

The present invention may be easily implemented in many standard MOS processes, such as, for example, p– well, n– well, twin-tub (n– and p– wells), and the like. It provides less stress to the dielectric layer under the gate region and increased breakdown voltages on the order of 25%.

Figure 4:
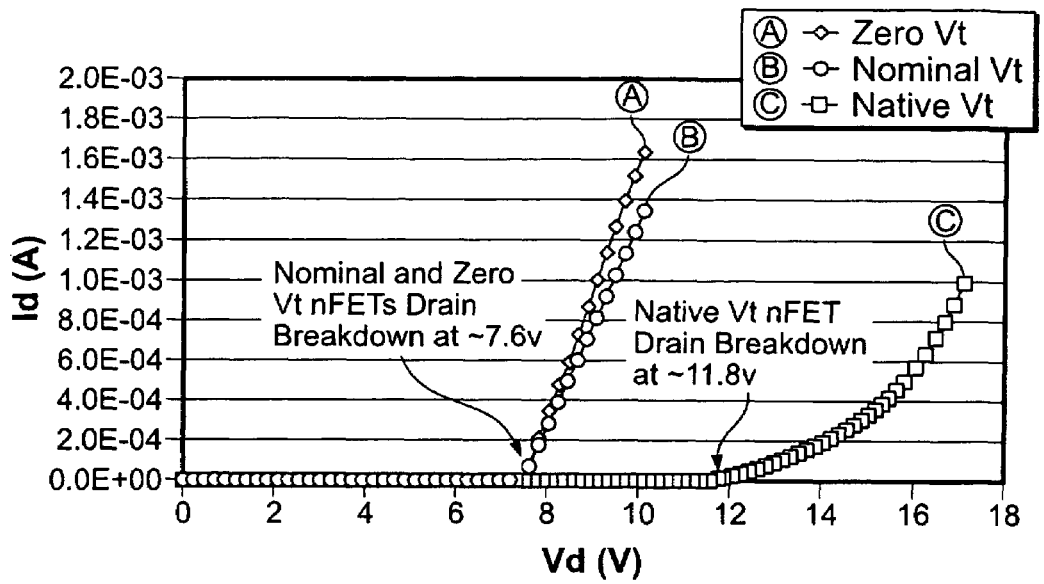
FIG. 4 is a plot of Id-Vd (Drain Current-Drain-Voltage) curves for nominal and zero Vt (threshold voltage—the voltage needed to turn on a transistor) low-voltage n-channel MOSFET in comparison to a low-voltage native NMOSFET in accordance with an embodiment of the present invention under various conditions. Nominal and zero Vt n-channel MOSFETs are processed with channel and anti-punch-through doping in a p– well or the substrate, however, native NMOSFETs are processed without channel and anti-punch-through doping in the substrate.

FIG. 4 is a plot of Id-Vd (Drain Current-Drain-Voltage) curves showing drain currents and breakdown voltages for low-voltage n-channel MOSFETs under various conditions. In FIG. 4 there are three data sets plotted. Data set "A" is from a zero Vt (threshold voltage) NFET in standard CMOS process with the gate allowed to float and the length and width of the transistor about the same. Data set "B" is from a nominal Vt NFET in standard CMOS process with the gate allowed to float and the length and width of the transistor about the same. The nominal and zero Vt nFETs experienced a drain breakdown at about 7.6 volts. Data set "C" is from a native Vt NFET in accordance with an implementation of the present invention fabricated without a p– well in a standard logic CMOS process with the gate allowed to float and the length and width of the transistor about the same. This native Vt NFET experienced a drain breakdown at about 11.8 volts.

Figure 5:
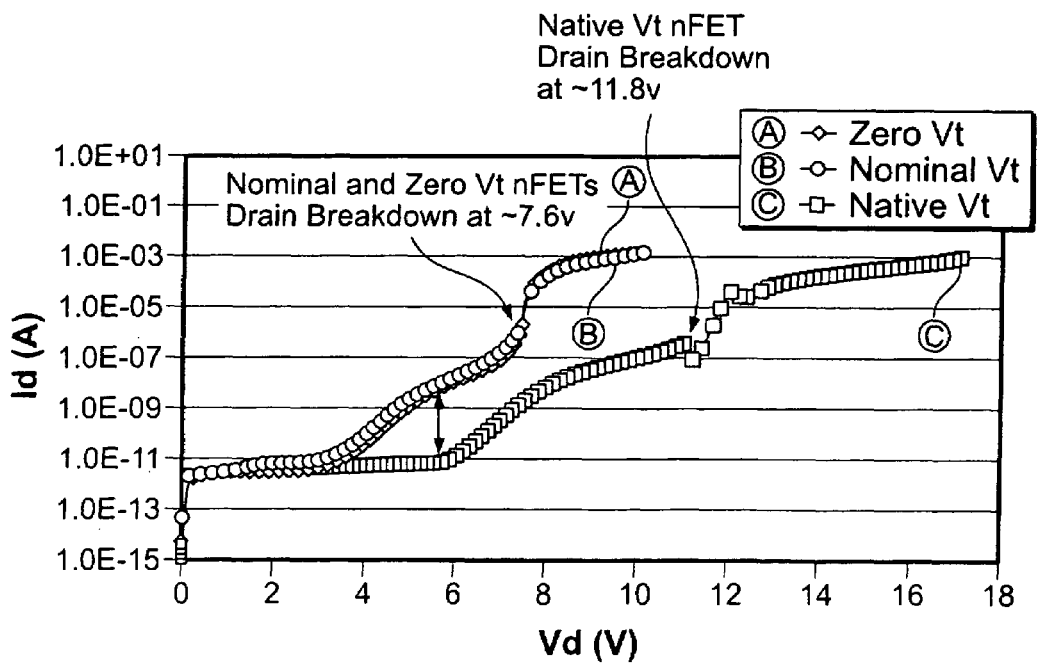
FIG. 5 is a version of the plot of FIG. 4 with the vertical axis (current in amperes) given in log scale.

FIG. 5 is a version of the plot of FIG. 4 with the vertical axis (current in amperes) given in log scale. This version illustrates that leakage current in the native device is approximately 1% of that in the other two devices.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A high-voltage n-channel MOSFET, comprising:
a native p– doped substrate having no p– well;
a first n+ doped source region disposed in said substrate;
a source terminal coupled to said first n+ doped region;
an n– well disposed in said substrate;
a second n+ doped drain region disposed in said n– well;
a drain terminal coupled to said second n+ doped region;
a channel region disposed between said source region and said drain region;
a p+ doped region disposed in said substrate;
a body terminal coupled to said p+ doped region;
a p– substrate/n– well junction region disposed at the interface of said p– substrate and said n– well;
a dielectric layer disposed over said channel region;
a first isolator disposed in said n– well, said isolator including a dielectric material that is in contact with said dielectric layer;
a second isolator disposed at least partially in said n– well, said second isolator including a dielectric material and isolating said second n+ region from said p+ region; and
a gate disposed over said dielectric layer and a portion of said first isolator, said gate comprising at least a first region of p+ doped semiconductor material and a second region of a different material contiguous with said first region of p+ doped semiconductor material.

2. The high-voltage n-channel MOSFET of claim 1, wherein said p+ doped semiconductor material is p+ doped polysilicon.

3. The high-voltage n-channel MOSFET of claim 1, wherein said gate comprises a layer having a region of p+ doped semiconductor layer surrounded by a first region of n+ doped semiconductor and a second region of n+ doped semiconductor.

4. The high-voltage n-channel MOSFET of claim 1, wherein said gate comprises metal.

5. The high-voltage n-channel MOSFET of claim 1, wherein said dielectric material is silicon dioxide.

6. The high-voltage n-channel MOSFET of claim 1, wherein said isolators are formed with an STI process.

7. The high-voltage n-channel MOSFET of claim 1, wherein said isolators are formed with a LOCOS process.

8. The high-voltage n-channel MOSFET of claim 1, wherein:
the MOSFET is fabricated using a process technology providing an MFS (Minimum Feature Size) of no greater than 0.18 microns.

9. The high-voltage n-channel MOSFET of claim 8, wherein:
the isolators are fabricated using STI.

10. The high-voltage n-channel MOSFET of claim 9, wherein:
a length of a dimension Lw of a region of lateral diffusion under the gate is greater than or equal to 0.0 microns;
a length of a dimension Lc of the channel is greater than or equal to 0.7 microns;
a length of a dimension Ldp corresponding to the width of the first isolator is greater than or equal to 0.8 microns; and
a length of a dimension Lo of a region extending from an end of the channel to an end of the gate is greater than or equal to 0.4 microns.

11. The high-voltage n-channel MOSFET of claim 8, wherein:
the isolators are fabricated using LOCOS.

12. The high-voltage n-channel MOSFET of claim 11, wherein:
a length of a dimension Lw of a region of lateral diffusion under the gate is greater than or equal to 0.2 microns;
a length of a dimension Lc of the channel is greater than or equal to 0.7 microns;
a length of a dimension Ldp corresponding to the width of the first isolator is greater than or equal to 0.8 microns; and
a length of a dimension Lo of a region extending from an end of the channel to an end of the gate is greater than or equal to 0.4 microns.

13. A high-voltage n-channel MOSFET, comprising:
a native p– doped substrate having no p– well;
a first n+ doped source region disposed in said p– doped substrate;
a source terminal coupled to said first n+ doped source region;
an n– well disposed in said substrate;
a second n+ doped drain region disposed in said n– well;
a drain terminal coupled to said second n+ doped region;
a channel region disposed between said source region and said drain region;
a p+ doped region disposed in said substrate;
a body terminal coupled to said p+ doped region;
a junction region formed at an interface of p– substrate material and n– well material under said channel region;
a dielectric layer disposed over said channel region;
a first isolator disposed in said n– well, said isolator including a dielectric material that is in contact with said dielectric layer;
a second isolator disposed at least partially in said n– well, said second isolator including a dielectric material and isolating said second n+ region from said p+ region; and
a gate disposed over at least a portion of said channel region, said gate comprising a layer having a first region of p+ doped semiconductor material and a second region of a different material contiguous with the first region of p+ doped semiconductor material.

14. The high-voltage n-channel MOSFET of claim 13, wherein said p+ doped semiconductor material comprises polysilicon.

15. The high-voltage n-channel MOSFET of claim 13, wherein said second region comprises n+ doped semiconductor material.

16. The high-voltage n-channel MOSFET of claim 13, wherein said second region comprises metal.

17. The high-voltage n-channel MOSFET of claim 13, wherein said dielectric material is silicon dioxide.

18. The high-voltage n-channel MOSFET of claim 13, wherein said isolators are formed with an STI process.

19. The high-voltage n-channel MOSFET of claim 13, wherein said isolators are formed with a LOCOS process.

20. The high-voltage n-channel MOSFET of claim 13, wherein:
the MOSFET is fabricated using a process technology providing an MFS (Minimum Feature Size) of no greater than 0.18 microns.

21. The high-voltage n-channel MOSFET of claim 20, wherein:
the isolators are fabricated using STI.

22. The high-voltage n-channel MOSFET of claim 21, wherein:
a length of a dimension Lw of a region of lateral diffusion under the gate is greater than or equal to 0.0 microns;
a length of a dimension Lc of the channel is greater than or equal to 0.7 microns;
a length of a dimension Ldp corresponding to the width of the first isolator is greater than or equal to 0.8 microns; and
a length of a dimension Lo of a region extending from an end of the channel to an end of the gate is greater than or equal to 0.4 microns.

23. The high-voltage n-channel MOSFET of claim 20, wherein:
the isolators are fabricated using LOCOS.

24. The high-voltage n-channel MOSFET of claim 23, wherein:
a length of a dimension Lw of a region of lateral diffusion under the gate is greater than or equal to 0.2 microns;
a length of a dimension Lc of the channel is greater than or equal to 0.7 microns;
a length of a dimension Ldp corresponding to the width of the first isolator is greater than or equal to 0.8 microns; and
a length of a dimension Lo of a region extending from an end of the channel to an end of the gate is greater than or equal to 0.4 micron.

* * * * *